United States Patent [19]
Uzoh et al.

[11] Patent Number: 5,807,165
[45] Date of Patent: Sep. 15, 1998

[54] METHOD OF ELECTROCHEMICAL MECHANICAL PLANARIZATION

[75] Inventors: Cyprian Emeka Uzoh, Hopewell Junction; James McKell Edwin Harper, Yorktown Heights, both of N.Y.

[73] Assignee: International Business Machines Corporation, Armonk, N.Y.

[21] Appl. No.: 827,340

[22] Filed: Mar. 26, 1997

[51] Int. Cl.⁶ ................................................. B24B 1/00
[52] U.S. Cl. .......................... 451/41; 451/5; 451/60; 451/286
[58] Field of Search ......................... 451/41, 60, 5, 451/285–289, 446, 93, 36, 37, 39

[56] References Cited

U.S. PATENT DOCUMENTS

| | | | |
|---|---|---|---|
| 4,793,895 | 12/1988 | Kaanta et al. | 156/627 |
| 4,821,466 | 4/1989 | Kato et al. | 451/36 |
| 4,934,102 | 6/1990 | Leach et al. | 51/50 |
| 5,078,801 | 1/1992 | Malik | 451/285 |
| 5,225,034 | 7/1993 | Yu et al. | 156/636 |
| 5,240,552 | 8/1993 | Yu et al. | 156/36 |
| 5,449,313 | 9/1995 | Kordonsky et al. | 451/35 |
| 5,492,594 | 2/1996 | Burke et al. | 216/86 |
| 5,534,106 | 7/1996 | Cote et al. | 156/636.1 |
| 5,543,032 | 8/1996 | Datta et al. | 205/670 |
| 5,567,300 | 10/1996 | Datta et al. | 205/652 |
| 5,575,706 | 11/1996 | Tsai et al. | 451/41 |

*Primary Examiner*—Robert A. Rose
*Assistant Examiner*—George Nguyen
*Attorney, Agent, or Firm*—Joseph P. Abate

[57] ABSTRACT

A method of planarizing a layer of a workpiece such as a semiconductor wafer includes rotating the layer against an electrolytic polishing slurry and flowing an electrical current through the slurry and through only one major side and/or minor sides of the layer, to remove portions of the layer. The one major side carries no microelectronic components which might be damaged by the current. At least a part of each step of rotating and of flowing occurs simultaneously. An apparatus for planarizing a layer includes a rotatable workpiece carrier, a rotatable platen arranged proximately to the carrier, a polishing pad mounted on the platen, and workpiece electrodes. The workpiece electrodes are movably attached to the carrier so as to engage electrically the minor sides of a layer when a workpiece is held on the carrier.

7 Claims, 12 Drawing Sheets

DISPOSABLE
CATHODE MESH

FIG. 11b1

DISPOSABLE
CATHODE

FIG. 17B

METHOD OF ELECTROCHEMICAL MECHANICAL PLANARIZATION

CROSS REFERENCE TO RELATED APPLICATIONS

This application is related to commonly-owned copending patent application 08/824,747, entitled Apparatus for Electrochemical Mechanical Planarization, by Cyprian E. Uzoh and James M. Harper, filed simultaneously herewith.

BACKGROUND OF THE INVENTION

1. Field of the Invention

The present invention relates to planarizing a workpiece and, more particularly, to planarizing a workpiece employed in fabricating semiconductor chips.

2. Description of the Prior Art

During the process of fabricating semiconductor chips (integrated circuits), metal conductors are used to interconnect the many microelectronic components which are disposed on a workpiece—for example, a substrate of a semiconductor material such as silicon. Typically, a thin, substantially flat, usually circular wafer of the semiconductor material is processed to include multiple thin layers of metal conductors, insulators and metal liners, in addition to the microelectronic components such as complementary metal oxide semiconductors (CMOS) devices.

Figure 1A:
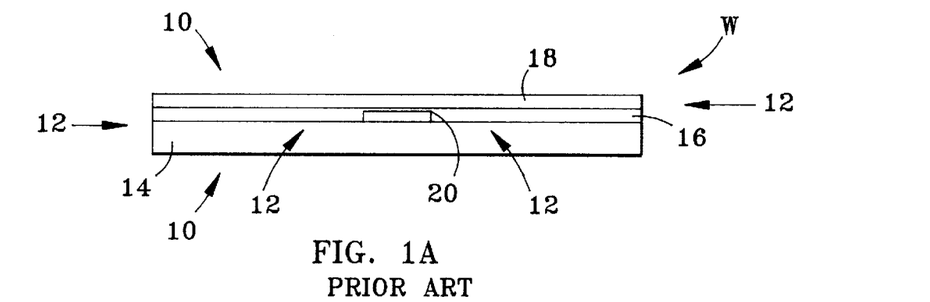
FIG. 1A is a side schematic view of a workpiece (eg, a semiconductor wafer w) to be processed according to a method and with an apparatus of the present invention.
Figure 1B:
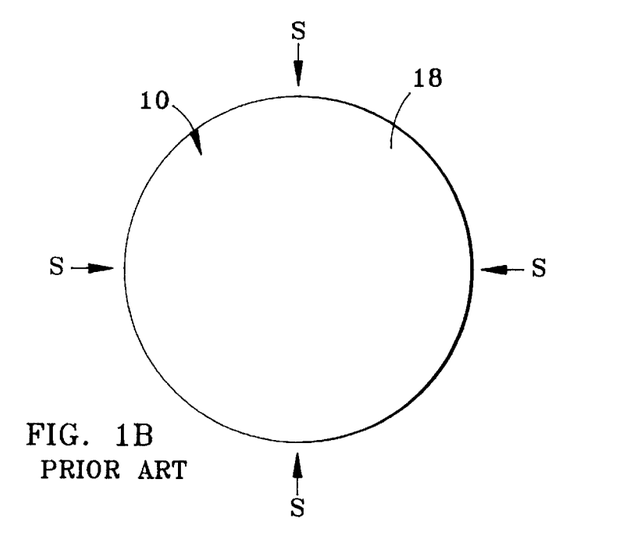
FIG. 1B is a top plan view of the wafer shown in FIG. 1A.

FIG. 1A shows a typical semiconductor wafer W during an interim step in a conventional fabrication process. The wafer W has two major sides 10 and a plurality of minor sides 12. As shown in FIG. 1B, the minor sides 12 form, for example, a substantially continuous circular side S around the wafer W. The wafer includes, for example, a Si substrate 14 having an insulator 16 (eg, a $SiO_2$ layer), a conductor 18 (eg, a Cu layer) and a microelectronic component 20 (eg, a CMOS device) disposed thereon. The component 20 is disposed, for example, in the substrate 14 and/or in the insulator 16. The conductor layer 18 forms substantially all of one major side 10 and forms part of the minor sides 12. The layer 18 is, eg, Cu, Al, Ti, Ta, Fe, Ag, Au, alloys or even magnetic films.

As wiring densities in semiconductor chips increase, multiple levels of the conductor layers 18 are required to achieve interconnections of the components 20. Thus, planarization of each conductor layer 18 and each insulator or dielectric layer 16 is a critical step in the chip fabrication process.

Various planarization methods and apparatus are known. Chemical mechanical planarization (CMP) includes holding, rotating and pressing a wafer so that the rotating conductor (eg, Cu metallic) layer 18 is pressed against a wetted planarization/polishing surface under controlled chemical, pressure and temperature conditions. Electrochemical planarization or machining (ECM) is based on electrochemical etching—dissolving a material (eg, a portion of the conductor layer 18) by combining the material with electricity and an aqueous solution of a salt.

Figure 2:
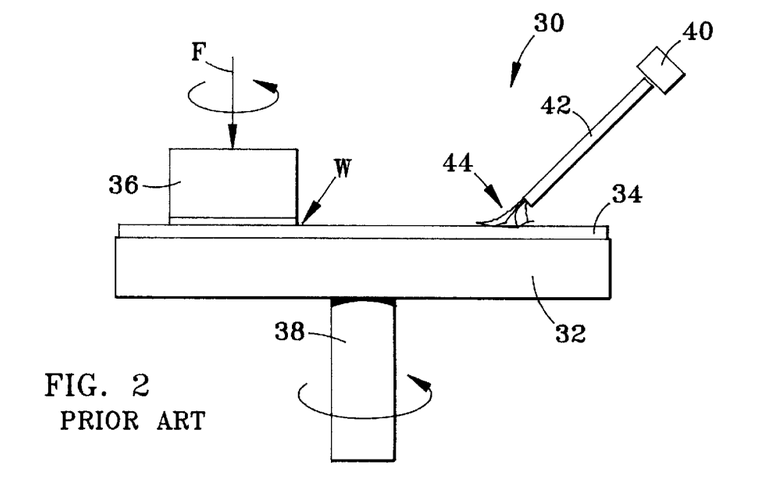
FIG. 2 is a side schematic view of a known CMP apparatus.

FIG. 2 shows a conventional CMP apparatus 30. The apparatus 30 includes a rotatable polishing platen 32 fixed to a rotatable shaft 38, a polishing pad 34 mounted on the platen 32, a rotatable workpiece carrier 36 arranged proximate to the platen 32 and adapted such that a suitable force (arrow F) is exerted on a workpiece W carried within a recess (not shown) of the carrier 36. The force F is generated, for example, by mechanical, electromechanical and/or pneumatic means well known. The apparatus 30 further includes a polishing slurry supply system including a reservoir or container 40 (eg, temperature controlled), a conduit 42 in fluid communication with the container 40 and the pad 34, and a chemical polishing slurry 44 held within the container 40. The slurry 44 is dispensable onto the pad 34 via the conduit 42.

Figure 3:
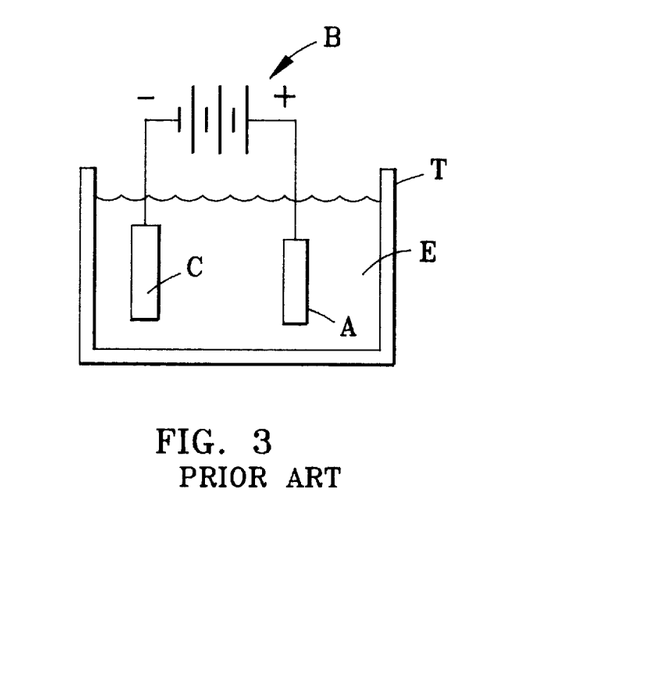
FIG. 3 is a side schematic view of a known ECM apparatus.

FIG. 3 shows a conventional electrochemical cell. Metal atoms in an anode A are ionized by electricity from a source of potential B (eg, a battery or other voltage source) and forced into a liquid electrolyte E held by a tank T. The metal anode A dissolves into the solution E at a rate proportional to the electric current, according to Faraday's law. The metal ions from the anode either plate a cathode C, fall out as a precipitate or stay in solution, depending on the chemistry of the metals and the solution.

See, for example, CMP, ECM and other known planarization methods and apparatus discussed in U.S. Pat. Nos.: 4,793,895; 4,934,102; 5,225,034; 5,534,106; 5,543,032; 5,567,300; and 5,575,706, which are all incorporated in their entireties by reference. U.S. Pat. No. 5,575,706, CHEMICAL/MECHANICAL PLANARIZATION (CMP) APPARATUS AND POLISH METHOD, Nov. 19, 1996, by Tsai et al discloses controlling a slurry concentration between a wafer and a pad through an application of an electric field between a wafer carrier and a polishing platen.

The present inventors believe that known planarization methods and apparatus have not proven to be entirely satisfactory, because of workpiece throughput limitations resulting from bowing of the workpiece or from damage to the CMOS devices or other components present on the workpiece during planarization.

SUMMARY OF THE INVENTION

It is a principal object of the present invention to increase the throughput for planarizing workpieces such as semiconductor wafers.

It is an additional object of the present invention to planarize a semiconductor wafer while reducing damage to microelectronic components located on the wafer.

According to the present invention, certain elements of both chemical mechanical planarization and electrochemical planarization methods and apparatus are combined with additional elements and features to result in a novel and unobvious electrochemical mechanical planarization (ECMP) method and apparatus.

Thus, a method of planarizing a workpiece having a layer to be planarized includes performing at least a part of each of the following steps simultaneously: rotating the layer; pressing the layer against an electrolytic polishing slurry, and flowing an electrical current through the slurry and through only one major side and minor sides of the workpiece, to remove portions of the layer both electrochemically and mechanically. During an initial stage of the method, the current is controlled so that a highest removal rate is accomplished electrochemically. During a final stage, the current is controlled so that a highest removal rate is accomplished mechanically or chemical mechanically.

An apparatus for planarizing a workpiece includes a workpiece carrier, a rotatable platen, a polishing pad disposed on the platen, and workpiece electrodes disposed on the carrier. In one embodiment, the workpiece electrodes are arranged and dimensioned such that the electrodes contact the layer at only the minor sides of the workpiece. In another embodiment, the workpiece electrodes contact the layer at only the minor sides and one major side of the workpiece. The one major side contains no microelectronic components which might be damaged by the electrical current which flows during electrochemical removal of the layer.

The present inventors believe that the present invention significantly reduces the probability of damage to the workpiece. Bowing of the wafer is reduced, and flowing of the current is controlled to avoid any path through the microelectronic components.

Further and still other objects of the present invention will become more readily apparent when the following detailed description is taken in light with the accompanying drawing, in which:

DETAILED DESCRIPTION OF THE PREFERRED EMBODIMENTS AND BEST MODE

Figure 4:
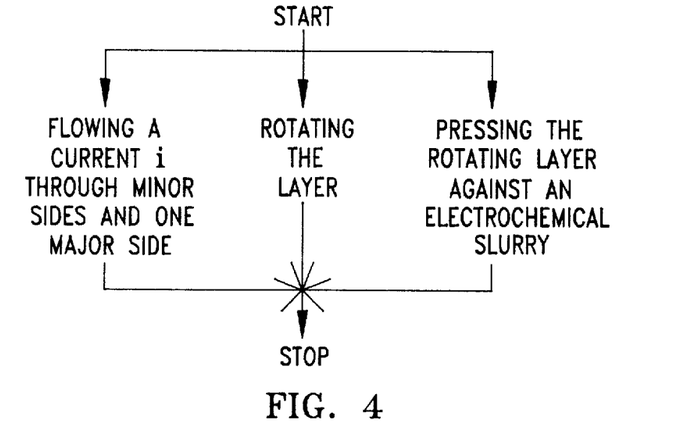
FIG. 4 is a high level flow diagram showing one preferred embodiment of the method according to the present invention.
Figure 5:
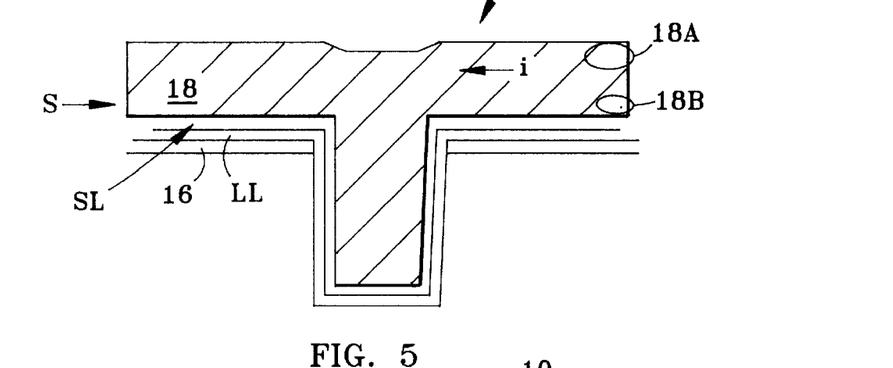
FIG. 5 is an enlarged side schematic view, partly in section, showing a detail of the wafer of FIGS. 1A and 1B prior to processing with the method and apparatus of the present invention.
Figure 6:
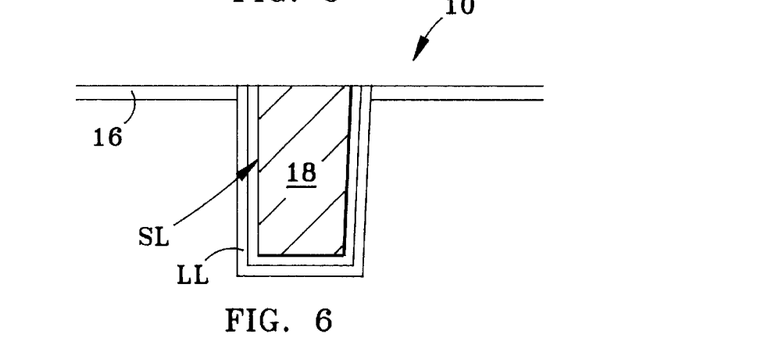
FIG. 6 is an enlarged side schematic view, partly in section, showing a detail of the wafer of FIGS. 1A and 1B subsequent to processing with the method and apparatus of the present invention.
Figure 7:
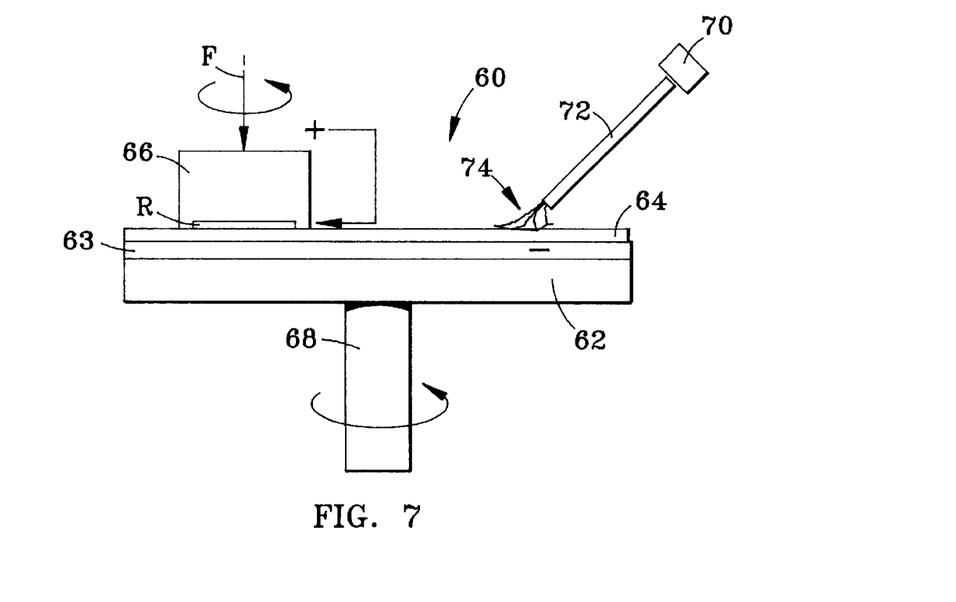
FIG. 7 is a side schematic view of a preferred embodiment of an ECMP apparatus 60 according to the present invention.
Figure 8:
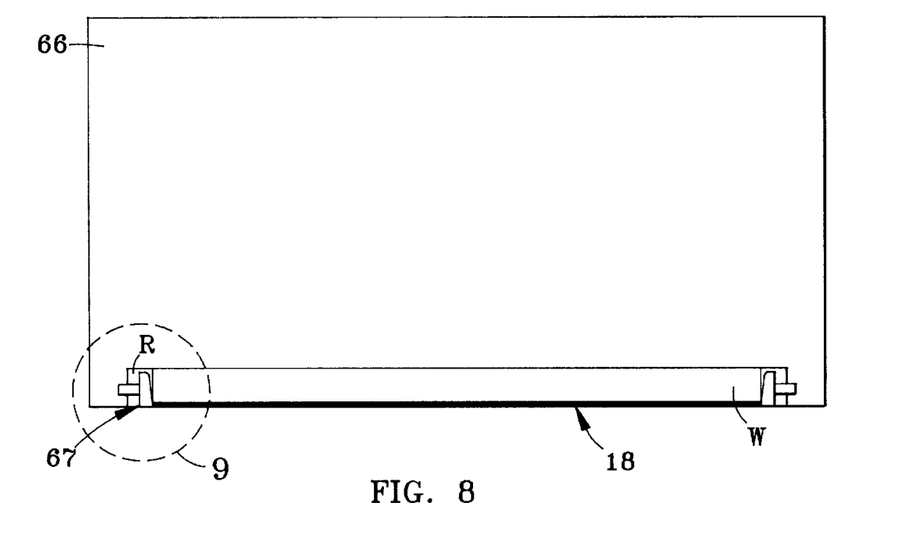
FIG. 8 is an enlarged side schematic view of the workpiece carrier 66 of FIG. 7, showing the wafer W being carried in a recess R and showing a plurality of workpiece electrodes 67 electrically contacting the sides S of the conductor layer 18.

Referring now to the drawing and to FIGS. 4–14 in particular, there are shown a high level logic flow diagram (FIG. 4) of an inventive method and various embodiments and features of an inventive apparatus 60 (FIGS. 7–14) for practicing the method on a wafer W having a layer 18 (FIG. 5) to be planarized (FIG. 6). In the method of FIG. 4, at least a part of each of the steps of rotating, pressing and flowing occurs simultaneously. During initial and intermediate stages of preferred embodiments of the inventive method when, for example, large amounts of excess material exists in the layer 18 (eg, Cu), a relatively large electrochemical current i (conventional current direction is shown in FIGS. 9–11, 13) flows through suitable parts (eg, the minor sides or surfaces and one of the major sides or surfaces) of the layer 18. The current i is, for example, of a magnitude to produce a current density of approx. 15–60 mA/(cm$^2$). Simultaneously with the flow of the current i, wafer rotation is in a range of 25–100 rpm, platen rotation is in a range of 25–90 rpm, pressure on the wafer is in a range of cone-half (0.5)–eight (8) psi against a suitable electrolytic polishing slurry 74 (FIG. 7).

Thus, first portions 18A (FIG. 5) of the layer 18 are preferably removed substantially electrochemically. Suitable slurries 74 for initial and intermediate stages include by, eg, volume $H_2SO_4$ (0.1%–2%), $H_2O_2$ (0.1%–1%), Benzotriazole (BTA-200 ppm to 7% concentration), and a nonionic surfactant such as Alkanol ACN distributed by E. I. Dupont Co., in combination with water and silica (or alumina). These slurries are aggressive. As the thickness of the layer 18 is decreased, the current i is decreased or discontinued, and the chemical-mechanical action of the slurry 74 on the rotating layer 18 becomes dominant to remove the remaining portions. Thus, second portions 18B (FIG. 5) are preferably removed substantially chemical-mechanically. Suitable gentle slurries 74 for final stages of the method include, eg, $CuSO_4$ (1–3%), $H_2SO_4$ (0.1%), Alkanol ACN, BTA, in combination with water and silica (or alumina). Boundaries for the initial, intermediate and final stages of the method are determined, for example, empirically depending upon the composition of the layer 18. Any suitable planarization endpoint detection arrangement can be used such as arrangements disclosed in U.S. Pat. No. 4,793,895, previously incorporated herein.

Figure 9:
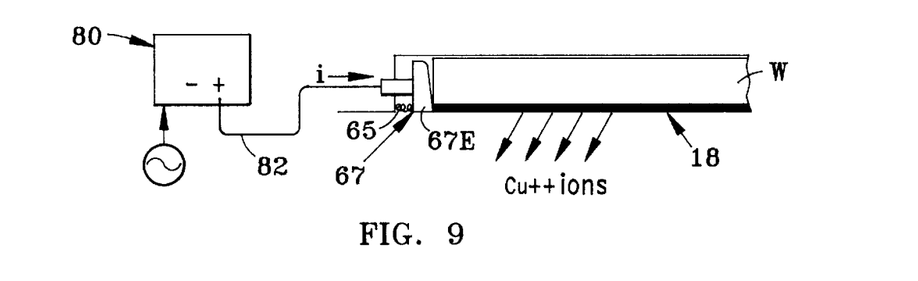
FIG. 9 is an enlarged side schematic view of the circled region of FIG. 8, showing a spring 65 mechanically biasing a conductive part 67E of one electrode 67 to contact the conductor (eg, Cu) layer 18; the part 67E being electrically connected to a source of potential 80 by means of electrical conductors 82.
Figure 10:
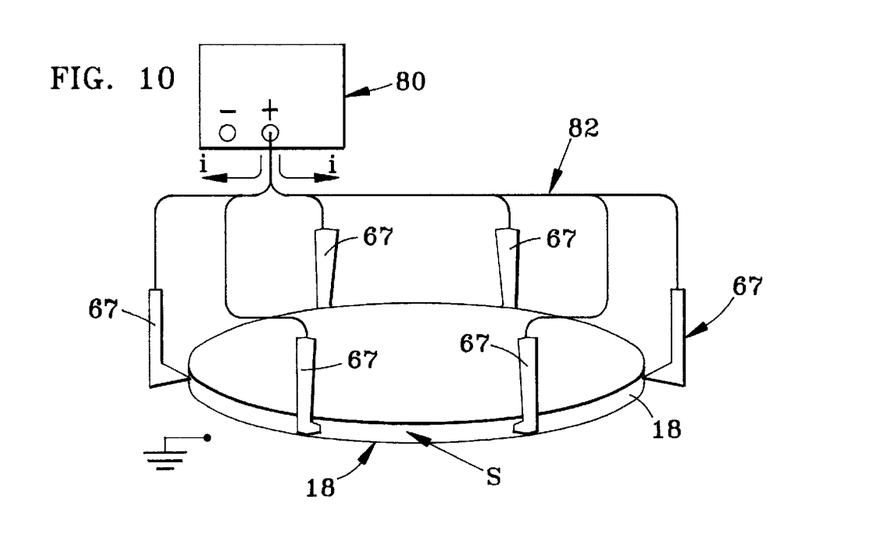
FIG. 10 is a more detailed schematic view of the source 80 connected to the electrodes 67.
Figure 13:
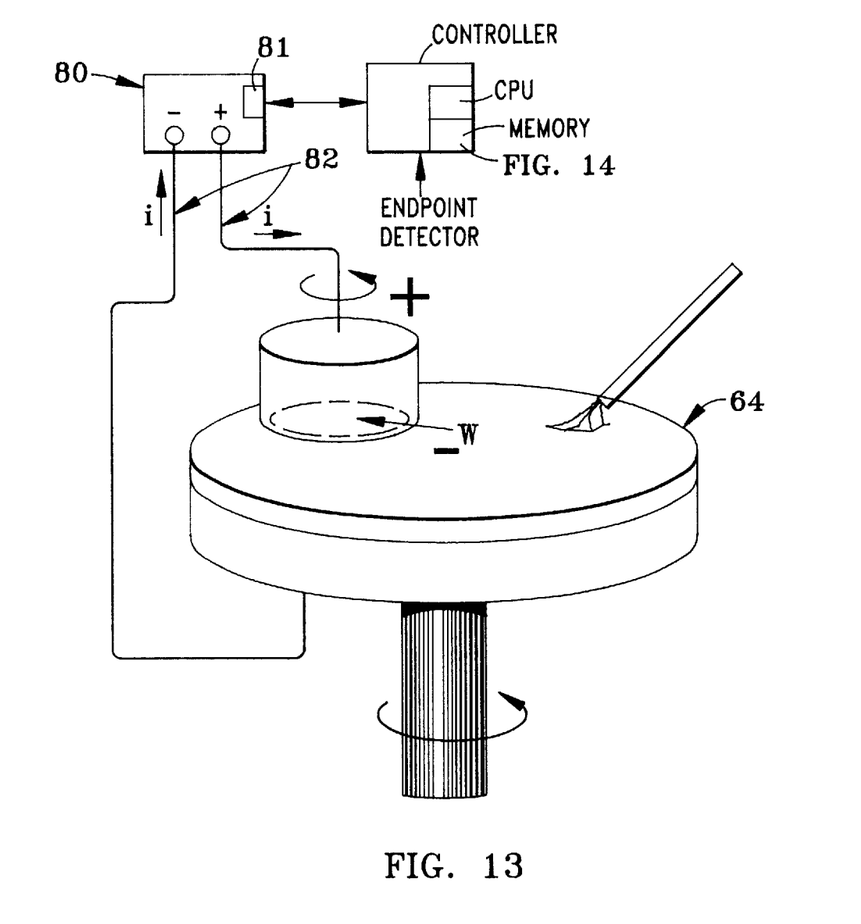
FIG. 13 is a schematic view of further alternative features of the invention, showing circuit 81 of the source 80 connected to a controller having suitable software for causing the source 80 to vary the electrochemical current i according to desired profiles.
Figure 14:
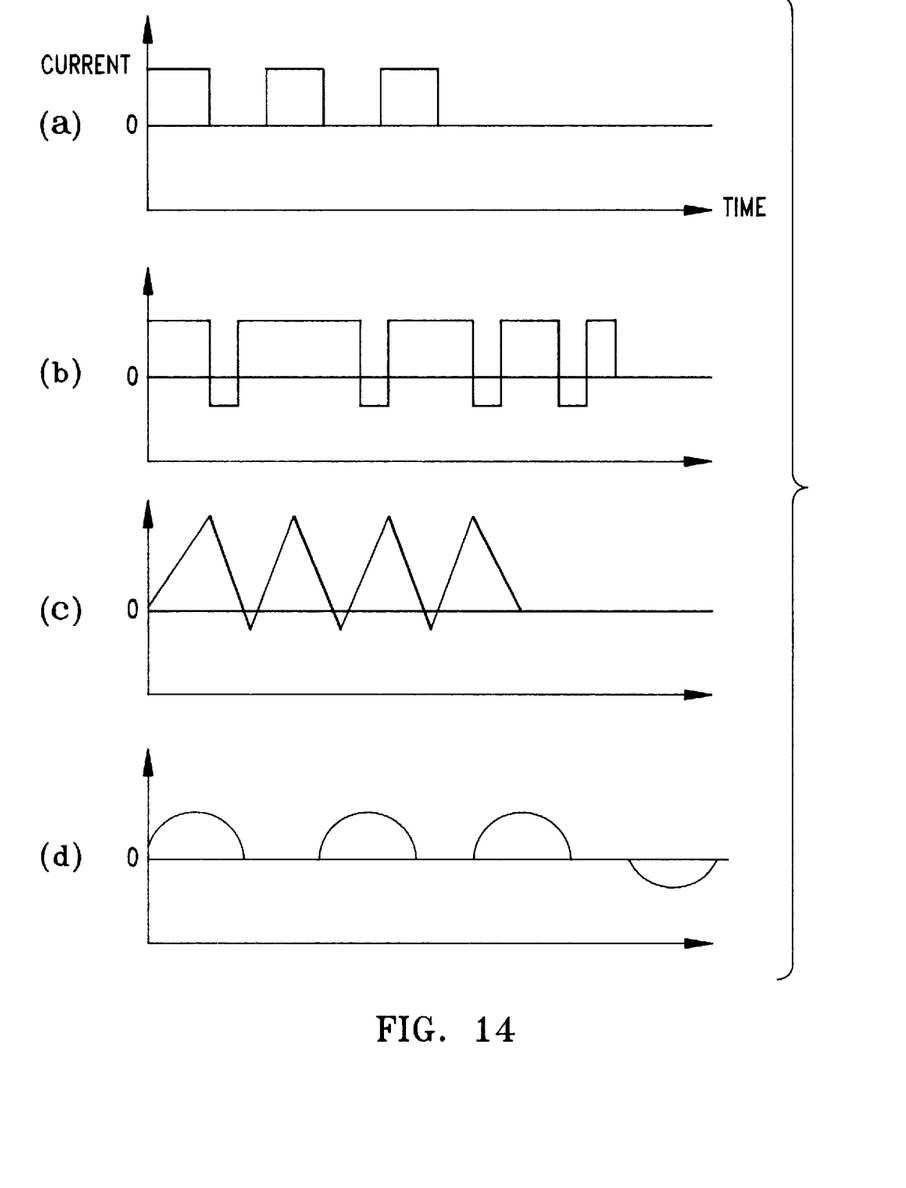
FIG. 14 shows four graphs of various current vs. time profiles (waveforms) for the electroetching current i.

FIG. 14 shows a plurality of current vs. time waveforms for the electroetching current i, which are generated by a suitable source of potential 80 (eg, electrical power supply eg, FIGS. 9, 13). The waveform: (a) is pulsed DC, single anodic polarity; of course a steady DC signal can be used; (b) is pulsed DC with alternating polarity; (c) is triangular or sawtooth with alternating polarity, or (d) is of a variable magnitude-single or alternating polarity. Of course, signals corresponding to various waveforms of current vs. time may be provided by the source 80 to the wafer W in order to optimize the relative magnitudes of electroetching, depolarization and purely chemical mechanical planarization effects. Duty cycles are, for example, 10%–75%.

Preferably, the source of potential 80 is electronic computer controlled—FIG. 13. FIG. 13, the source 80 includes or is connected to a controller having a CPU (eg, microprocessor), Memory, Buses, I/O ports, all suitably interconnected to signal receiver circuits 81 and to an endpoint detector arrangement, to control the current i according, eg, to the waveforms of FIG. 14. Software instructions and data can be coded and stored within the Memory, for causing the controller to generate suitable signals to the source 80 to control the current i.

FIG. 6 shows the layer 18 immediately following completion of planarization according to the method of, eg, FIG. 4. The wafer W may include a seed layer SL 9 (eg, Cu) and a metal liner layer LL (eg, Ta, TaN, alpha-Ta, Chrome, TiN). The layer LL may function as a redundant conductor of the current i into or along the layer 18, particularly as extremities of the layer 18 in direct contact with electrodes 67 are removed.

A preferred embodiment of an apparatus 60 for practicing the method of the invention is shown in FIGS. 7–10. The apparatus 60 includes a rotatable workpiece carrier 66, a plurality of workpiece electrodes 67 disposed in a recess R of the carrier 66, a rotatable platen 62 attached to a rotatable shaft 68, a platen electrode 63 attached to (eg, disposed in) the platen 62, a polishing pad 64 mounted on the platen 62, a means for urging (eg, force arrow F) the carrier 66 against the pad 64, and a slurry supply system in fluid communication with the pad 64. The supply system includes a container 70 coupled to a conduit 72 arranged and dimensioned for dispensing an electrolytic polishing slurry 74 onto the pad 64 during a normal operation of the apparatus 60. During at least a part of such operation, the electrodes 67 (and the layer 18) are anodic and the electrode 63 and platen 62 are cathodic. The carrier 66 and the platen 62 are, for example, stainless steel, while the pad 64 is, for example, a conventional soft fabric or hard polyurethane, provided that the pad 64 has sufficient porosity such that an ionic current can flow through the pad to the slurry and to the layer 18. See, eg, U.S. Pat. No. 5,534,106, previously incorporated herein. As previously discussed, the slurry is a suitable aqueous electrolyte including abrasive particles of, eg, silica or alumina.

Preferably, the electrically conductive electrodes 67 are arranged and dimensioned in the recess R so as that an electrode portion 67E (eg, Cu, Al, Ag, Au, Sn, Fe or suitable combinations thereof or alloys) contacts the layer 18 at only the minor sides S of the workpiece or layer. See FIGS. 8–10. A spring 65 mechanically biases each portion 67E against the side S. The electrodes 67 are connected to the source 80 via electrically conductive wires 82, and the electrodes 67 and the wires 82 are electrically insulated from the carrier by means of any suitable electrically insulative material such as a synthetic rubber. The current i flows through the portion 67E directly into the layer 18 at the area of contact.

Figure 11A:
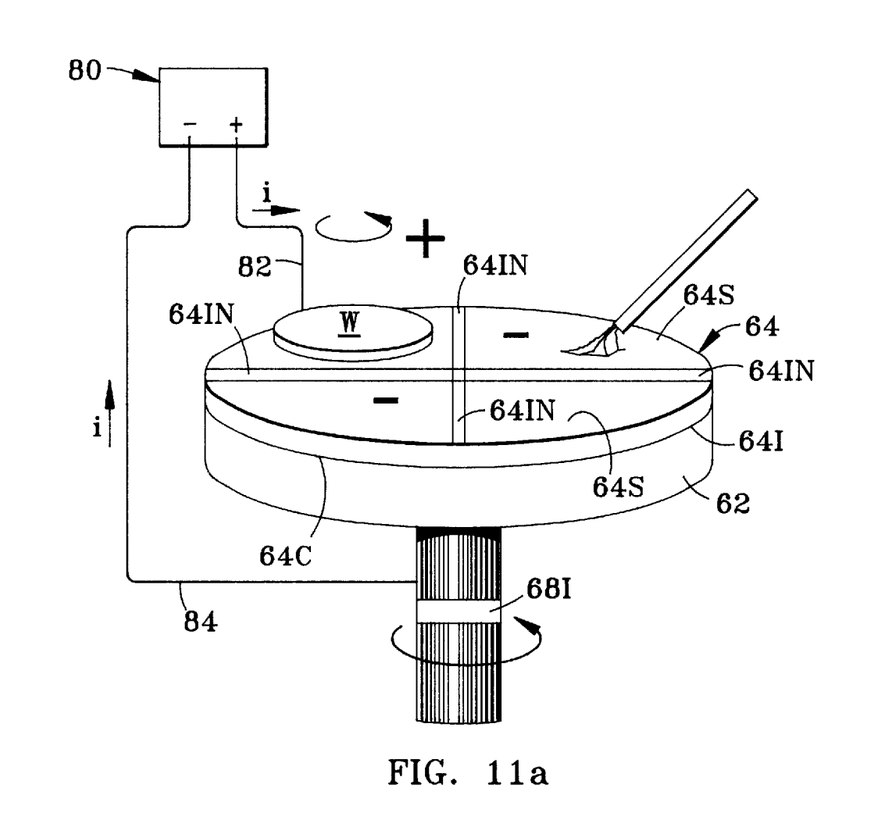
FIGS. 11a–11d are schematic views showing several alternative embodiments of the pad 64 and the platen 62, among other elements of the present invention.
Figure 11B:
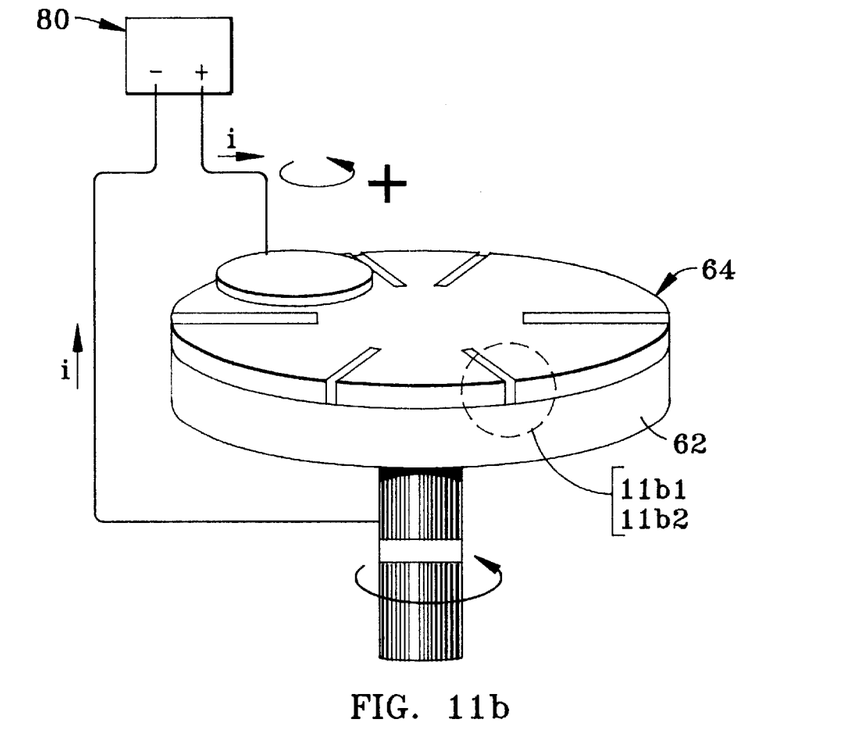
Figure 11B:
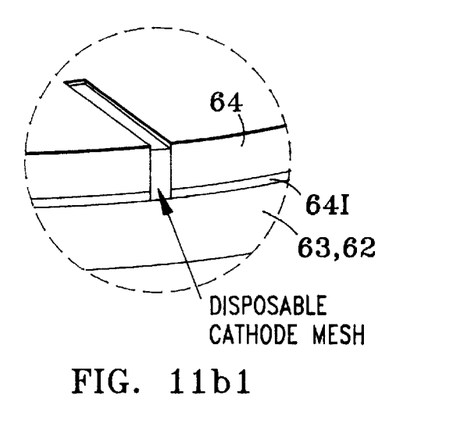
Figure 11B:
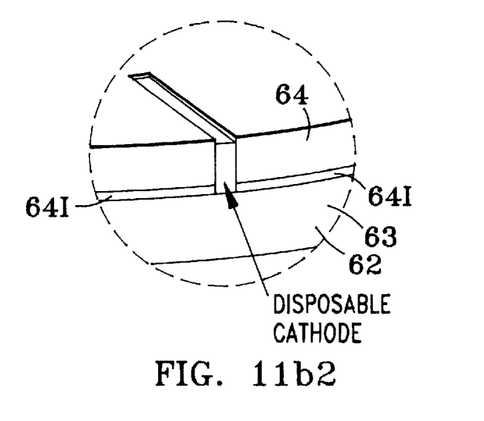
Figure 11C:
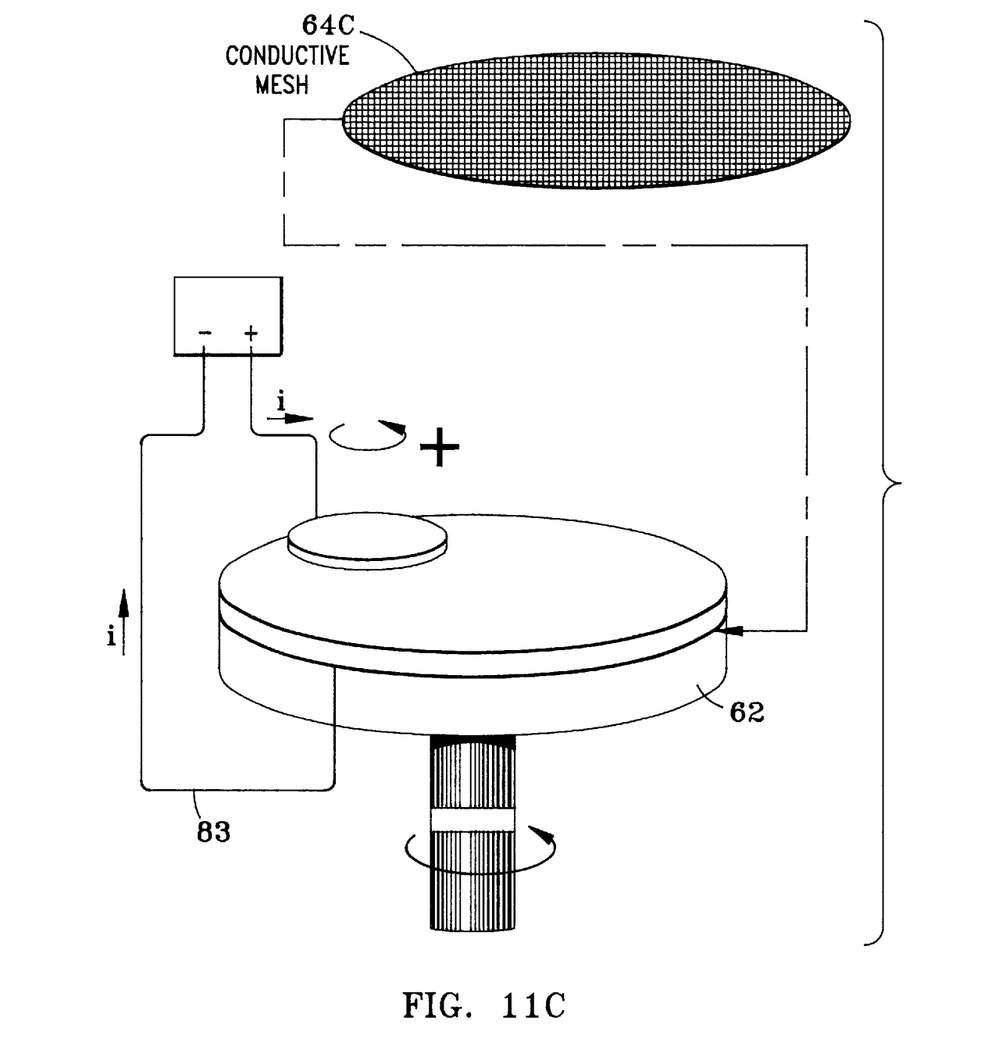
Figure 11D:
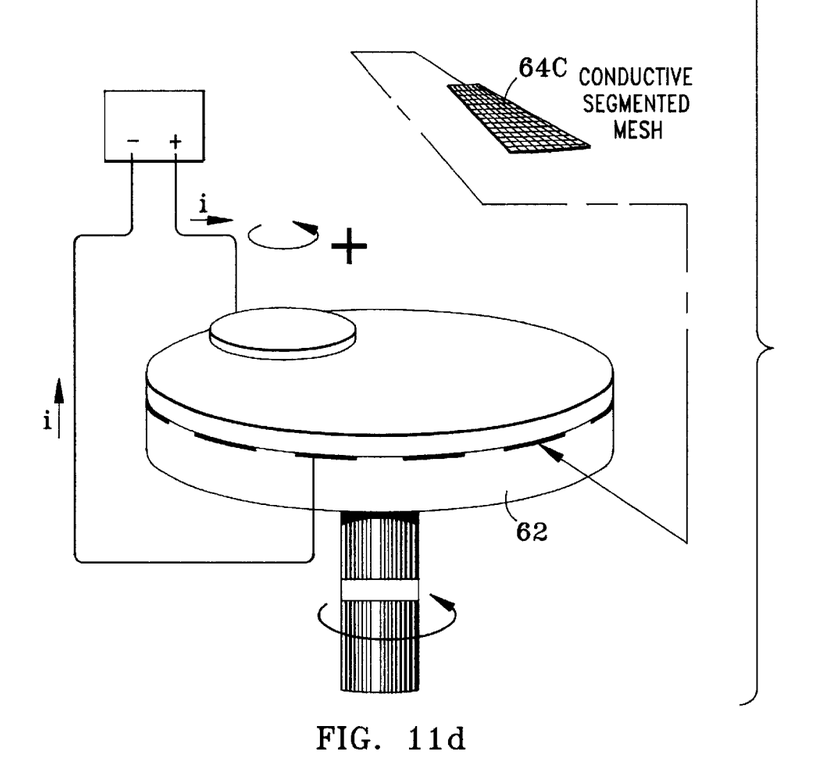

FIGS. 11a–11d show additional alternative embodiments and features of the present invention. In FIG. 11a, the pad 64 is segmented electrically into sections 64S by means of insulators 64IN. The insulators 64I are suitable insulating solids (eg, one-five mm thick and deep) or are suitable air gaps. The pad 64 includes, eg, conductive sheet sections 64C and insulative sheet sections 64I on the side of the pad which contacts the platen 62. The shaft 68 includes an insulator 68I, so that an electrical connection of the conductive platen 62 to ground is not required. FIGS. 11b, 11b.1, and 11b.2 show removable cathodes (eg, copper mesh) disposed within channels formed within the pad 64. The electrode 63 and the platen 62 may be separate parts, or may be formed integrally. FIGS. 11c and 11d show electrically conductive meshes 64C connected to the negative terminal of the supply 80 by means of slip rings (not shown) and wires 83.

Figure 12:
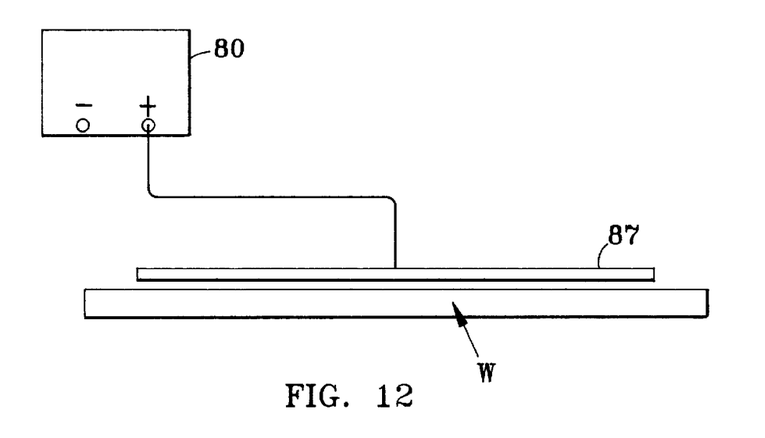
FIG. 12 is a schematic view showing a capacitive coupling arrangement for applying a positive potential to suitable parts of a workpiece W.
Figure 15:
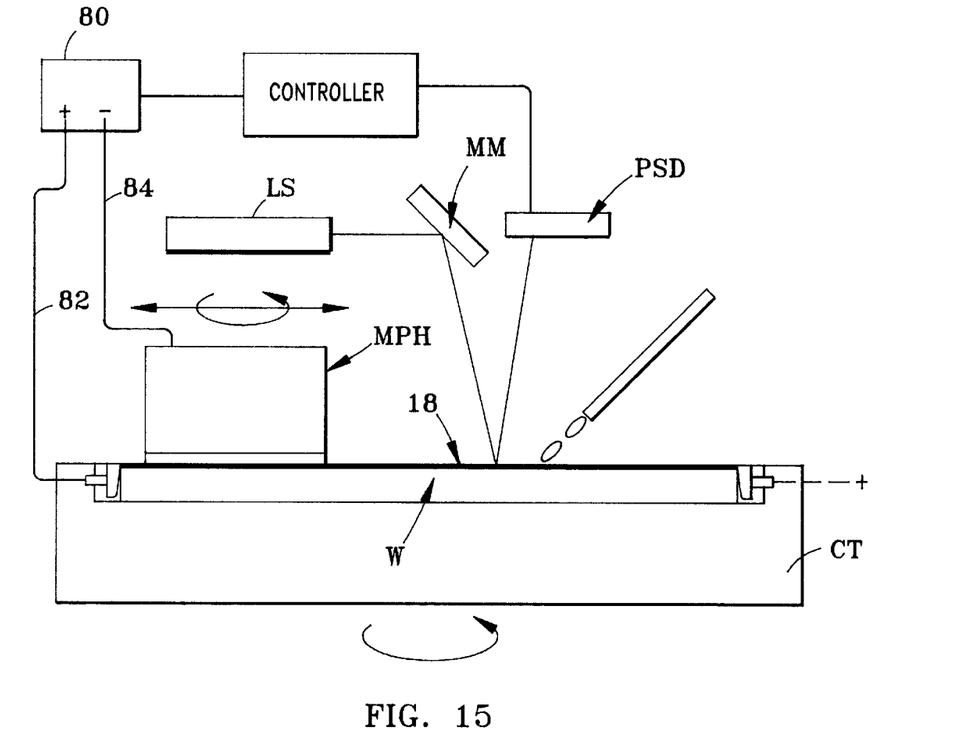
FIG. 15 is a schematic view of a further alternative embodiment of the invention, showing a wafer W held on a carrier table CT such that the layer 18 faces a movable polishing head MPH, and showing an endpoint detector such as an optical reflectivity monitor including a light source LS (eg, laser), a movable mirror MM and a position sensitive detector PSD which measures light intensity as a function of a position on the wafer. When the detector receives a detector signal indicating that the thickness of the layer 18 is very thin, or has been removed, the detector signal is interpreted by the controller to command the supply 80 to decrease the magnitude of the electrical potential provided by the supply 80.
Figure 16:
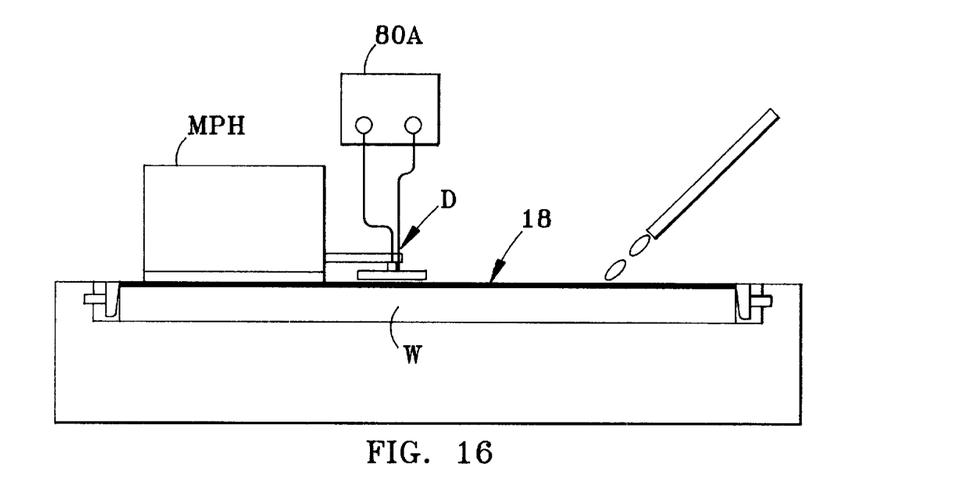
FIG. 16 is a side schematic view of a still further alternative embodiment having a capacitive or eddy current detector D attached to the head MPH and interfaced to a controller and power supply system 80A, which controls the anodic and cathodic potentials in response to signals corresponding to detected thicknesses of the layer 18 remaining on the wafer W.
Figure 17A:
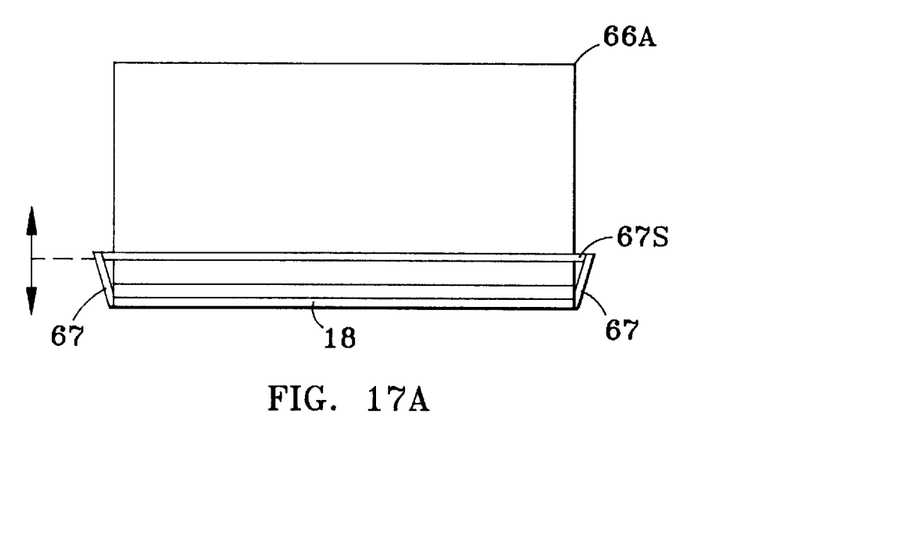
FIGS. 17A and 17B show an additional alternative embodiment for an electrode arrangement 67, particularly useful when a wafer is held on a conventional carrier 66A by, for example, a conventional vacuum arrangement so that the sides S are substantially colinear with the outside surfaces of the carrier 66A. The arrangement 67 includes a rigid insulated sleeve or collar 67S surrounding the carrier 66A and fixed to electrodes 67 so that an electrode portion 67E electrically contacts the side S during normal operation. The electrodes 67 are formed, eg, from a spring-tempered BeCu, Ta, titanium, or alpha-Ta. The arrangement 67 is movable in the directions of the arrow in FIG. 17A.
Figure 17B:
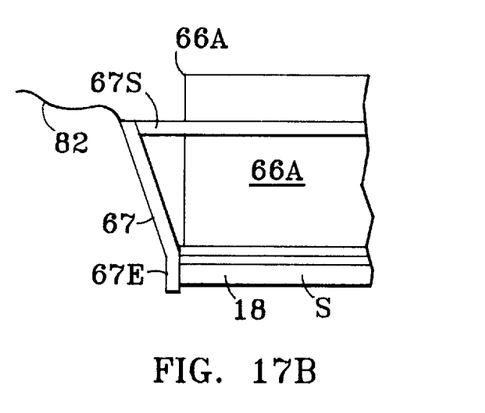

FIG. 12 shows a capacitive coupling arrangement for applying a positive potential to a wafer W, and is particularly useful when it is desired to remove a layer 18 which is a dielectric rather than a conductive material. FIGS. 15 and 16 show further alternative embodiments having a layer 18 facing a moveable polishing head mpH. FIGS. 17A, 17B show alternative electrode 67 arrangements for use with a conventional carrier 66A.

While there has been shown and described what is at present considered preferred embodiments of the present invention, it will be apparent to those skilled in the art that various changes and modifications may be made therein without departing from the spirit and scope of the invention which shall be defined by the appended claims. For example, the platen 62 and the carrier 66 may be formed of an insulative material such as anodized aluminum, in which event the cathodes are suitably connected to the power supply and the slurry. Alternatively, the cathodic electrode (eg, 64C) may be located within the slurry container 70. Also, of course, the methods and apparatus of the invention may be used with wafers having layers 18 to be planarized which are substantially concave rather than substantially flat.

What is claimed is:

1. A method of planarizing a workpiece including major sides and minor sides, one of the major sides and parts of the minor sides being formed of a layer to be planarized, said method comprising:

rotating the layer;

pressing the rotating layer against an electrolytic polishing slurry so as to remove a portion of the rotating layer substantially mechanically;

flowing an electrical current through the slurry and through only the one of the major sides and the parts of the minor sides so as to remove another portion of the layer substantially electrochemically, wherein at least a part of each of the steps of rotating, pressing and flowing occurs simultaneously.

2. The method as claimed in claim 1, wherein said step of flowing includes applying potentials to the layer and to the slurry such that the layer has a positive potential relative to the slurry.

3. The method as claimed in claim 1, wherein said step of flowing includes applying and varying potentials to the layer and to the slurry, such that the layer has a positive or a negative potential relative to the slurry.

4. The method as claimed in claim 1, further comprising collecting the another portion within channels formed in a polishing pad on which the slurry is disposed.

5. The method as claimed in claim 1, wherein said step of flowing includes applying potentials to the layer and to the slurry such that the layer has a positive potential relative to the slurry.

6. The method as claimed in claim 1, wherein said step of flowing includes applying and varying potentials to the layer and to the slurry, such that the layer has a positive or a negative potential relative to the slurry.

7. A method of planarizing a workpiece, said method comprising:

providing a workpiece, including major sides and minor sides, one of the major sides and parts of the minor sides being formed of a layer to be planarized;

rotating the layer;

pressing the rotating layer against an electrolytic polishing slurry so as to remove a portion of the rotating layer substantially mechanically;

flowing an electrical current through the slurry and along only the one of the major sides and the parts of the minor sides so as to remove another portion of the layer substantially electrochemically, wherein at least a part of each of the steps of rotating, pressing and flowing occurs simultaneously.

* * * * *